United States Patent
Chilappagari et al.

(10) Patent No.: US 8,825,945 B2
(45) Date of Patent: Sep. 2, 2014

(54) MAPPING DIFFERENT PORTIONS OF DATA TO DIFFERENT PAGES OF MULTI-LEVEL NON-VOLATILE MEMORY

(75) Inventors: Shashi Kiran Chilappagari, San Jose, CA (US); Xueshi Yang, Cupertino, CA (US); Gregory Burd, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 170 days.

(21) Appl. No.: 13/360,626

(22) Filed: Jan. 27, 2012

(65) Prior Publication Data

US 2012/0198135 A1    Aug. 2, 2012

Related U.S. Application Data

(60) Provisional application No. 61/437,975, filed on Jan. 31, 2011.

(51) Int. Cl.
| | | |
|---|---|---|
| *G06F 12/00* | (2006.01) | |
| *G06F 12/02* | (2006.01) | |
| *G06F 12/06* | (2006.01) | |

(52) U.S. Cl.
USPC .... 711/103; 711/101; 711/206; 711/E12.001; 711/E12.008; 711/E12.078

(58) Field of Classification Search
USPC ................................. 711/103, 213, 171, 137
See application file for complete search history.

(56) References Cited

U.S. PATENT DOCUMENTS

| | | | |
|---|---|---|---|
| 7,149,111 B2* | 12/2006 | Murin et al. | 365/185.03 |
| 7,747,903 B2 | 6/2010 | Radke | |
| 7,941,590 B2 | 5/2011 | Yang et al. | |
| 8,020,060 B2* | 9/2011 | Murin | 714/746 |
| 8,230,157 B2* | 7/2012 | Kim et al. | 711/103 |
| 8,355,279 B2* | 1/2013 | Yoon et al. | 365/185.03 |
| 2006/0155921 A1* | 7/2006 | Gorobets et al. | 711/103 |
| 2007/0089034 A1 | 4/2007 | Litsyn et al. | |
| 2007/0271494 A1 | 11/2007 | Gorobets | |
| 2009/0019321 A1 | 1/2009 | Radke | |
| 2009/0190397 A1 | 7/2009 | Cho et al. | |
| 2010/0125699 A1* | 5/2010 | Kong et al. | 711/103 |
| 2011/0090734 A1 | 4/2011 | Burger et al. | |
| 2011/0209028 A1* | 8/2011 | Post et al. | 714/758 |
| 2011/0252188 A1* | 10/2011 | Weingarten | 711/103 |

OTHER PUBLICATIONS

Boaz Eitan, Reza Kazerounian and Anirban Roy, Multilevel Flash cells and their Trade-offs, Dec. 11, 1996, IEEE, Electron Devices Meeting, 1996. IEDM '96., International, pp. 169-172.*

(Continued)

*Primary Examiner* — Mardochee Chery
*Assistant Examiner* — Kamal K Dewan

(57) ABSTRACT

The present disclosure includes systems and techniques relating to non-volatile memory. A described system, for example, includes a non-volatile memory structure having a plurality of multi-level memory cells, a processing device, and a controller. The controller is configured to map a first portion of a first set of consecutive bits of a data segment to a first page associated with the plurality of multi-level memory cells, and map a second portion of the first set of consecutive bits of the data segment to a second page associated with the plurality of multi-level memory cells. The first page is associated with bits of a first significance, and the second page is associated with bits of a second significance.

19 Claims, 12 Drawing Sheets

(56) References Cited

OTHER PUBLICATIONS

Lopez, Balaguer, Authorized Officer, European Patent Office, International Search Report and Written Opinion of the International Search Authority, dated May 10, 2012, Application No. PCT/US2012/023165, 14 pages.

Yang, Xueshi, Patent Application entitled Non-Volatile Memory Devices Having Uniform Error Distributions Among Pages, USPTO U.S. Appl. No. 12/842,724, filed Jul. 7, 2011, 41 pages, to be published by USPTO.

Yang, Xueshi, Patent Application entitled Data Type Based Alignment of Data Written to Non-Volatile Memory, USPTO U.S. Appl. No. 12/700,561, filed Feb. 4, 2010, 23 pages, to be published by USPTO.

Yang, Xueshi, Patent Application entitled Programming Method for Multi-Level Cell Flash for Minimizing Inter-Cell Interference, USPTO U.S. Appl. No. 12/881,127, filed Sep. 13, 2010, 50 pages, to be published by USPTO.

Baharlou, Simin, Authorized Officer, The International Bureau of WIPO, International Preliminary Report on Patentability, PCT Application No. PCT/US2012/023165, dated Aug. 6, 2013, 9 pages.

* cited by examiner

MAPPING DIFFERENT PORTIONS OF DATA TO DIFFERENT PAGES OF MULTI-LEVEL NON-VOLATILE MEMORY

CROSS REFERENCE TO RELATED APPLICATION

This disclosure claims priority U.S. Provisional Application No. 61/437,975, filed on Jan. 31, 2011, and titled "HOST DATA TO SOLID-STATE NON-VOLATILE MEMORY MAPPING", the entire contents of which are hereby incorporated by reference.

FIELD OF USE

The present disclosure relates to non-volatile memory.

BACKGROUND

A non-volatile memory structure can include memory cells such as flash memory cells. Memory cells can store data by trapping granulized amounts of charge in, for example, an isolated region of a transistor. This process of trapping charges can be referred to as programming. A controller can estimate an amount of charge stored during readout of the cell. Retrieving data from a memory cell can include applying a read voltage to the transistor and subsequently estimating the readout current which is determined by the amount of charge trapped in the cell.

Various examples of memory cells include a single level cell (SLC) or a multi-level cell (MLC). A SLC can store one bit of information. In such a memory cell, the memory cell can hold or not hold a charge. The presence or absence of a charge indicates, for example, logic 1 when a charge is stored, and logic 0 when no charge is stored. In contrast, a MLC can store more than one bit of information by taking advantage of the ability of such a memory cell to hold varying amounts of charge, e.g., charge levels. For example, in a multi-level memory cell with a maximum number Q of trapped charge, the cell can store more than one bit of information based on storing a granulized amount of charge between 0 and Q. For example, two bits of information can be stored in one multi-level memory cell by trapping any one of four levels of charges: 0, Q/3, 2Q/3, Q.

Devices and systems can store or retrieve data using non-volatile memory such as flash memory. For example, a digital camera can store an image to a non-volatile memory structure. In another example, a digital media player such as an MP3 player can read a digital audio file from non-volatile memory and play the contents of the audio file. Mobile devices such as a mobile phone or a personal digital assistant (PDA) can read data from and write data to one or more non-volatile memory structures.

Devices and systems can access non-volatile memory based on a data segment. A data segment can include a fixed amount of data, e.g., a fixed number of bytes. The devices and systems can issue commands to read and write the data segment to non-volatile memory. A data area can store one or more data segments. Non-volatile memory can perform operations, e.g., reading and programming operations, on a data area of non-volatile memory. Non-volatile memory such as flash memory can be divided into multiple data areas. Each data area can be individually addressed and accessed. A data area can be divided into individual bits or larger aggregate data units such as bytes.

SUMMARY

The present disclosure includes systems and techniques relating to non-volatile memory. According to an aspect of the described systems and techniques, a system includes a non-volatile memory structure that includes multi-level memory cells. The system includes a controller configured to map a first portion of a first set of consecutive bits of a data segment to a first page associated with the multi-level memory cells and map a second portion of the first set of consecutive bits of the data segment to a second page associated with the multi-level memory cells. The first page is associated with bits of a first significance, and the second page is associated with bits of a second significance.

In some implementations, the controller is configured to map a first portion of a second set of consecutive bits of the data segment to the first page and map a second portion of the second set of consecutive bits of the data segment to the second page. In some implementations, the first set of consecutive bits is a first sector of host data, and the second set of consecutive bits is a second sector of host data. In some implementations, the multi-level memory cells are flash cells.

According to another aspect of the described systems and techniques, a method includes mapping a first portion of a first set of consecutive bits of a data segment to a first page associated with multi-level memory cells and mapping a second portion of the first set of consecutive bits of the data segment to a second page associated with the multi-level memory cells. The first page is associated with bits of a first significance, and the second page is associated with bits of a second significance.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, an apparatus can include a memory interface configured to connect to multi-level memory cells. The apparatus can include circuitry coupled to the memory interface. The circuitry is configured to map a first portion of a first set of consecutive bits of a data segment to a first page associated with the multi-level memory cells and map a second portion of the first set of consecutive bits of the data segment to a second page associated with the multi-level memory cells. The first page is associated with bits of a first significance, and the second page is associated with bits of a second significance.

Details of one or more implementations are set forth in the accompanying drawings and the description below. Other features, objects, and advantages may be apparent from the description and drawings, and from the claims.

DRAWING DESCRIPTIONS

Figure 4:
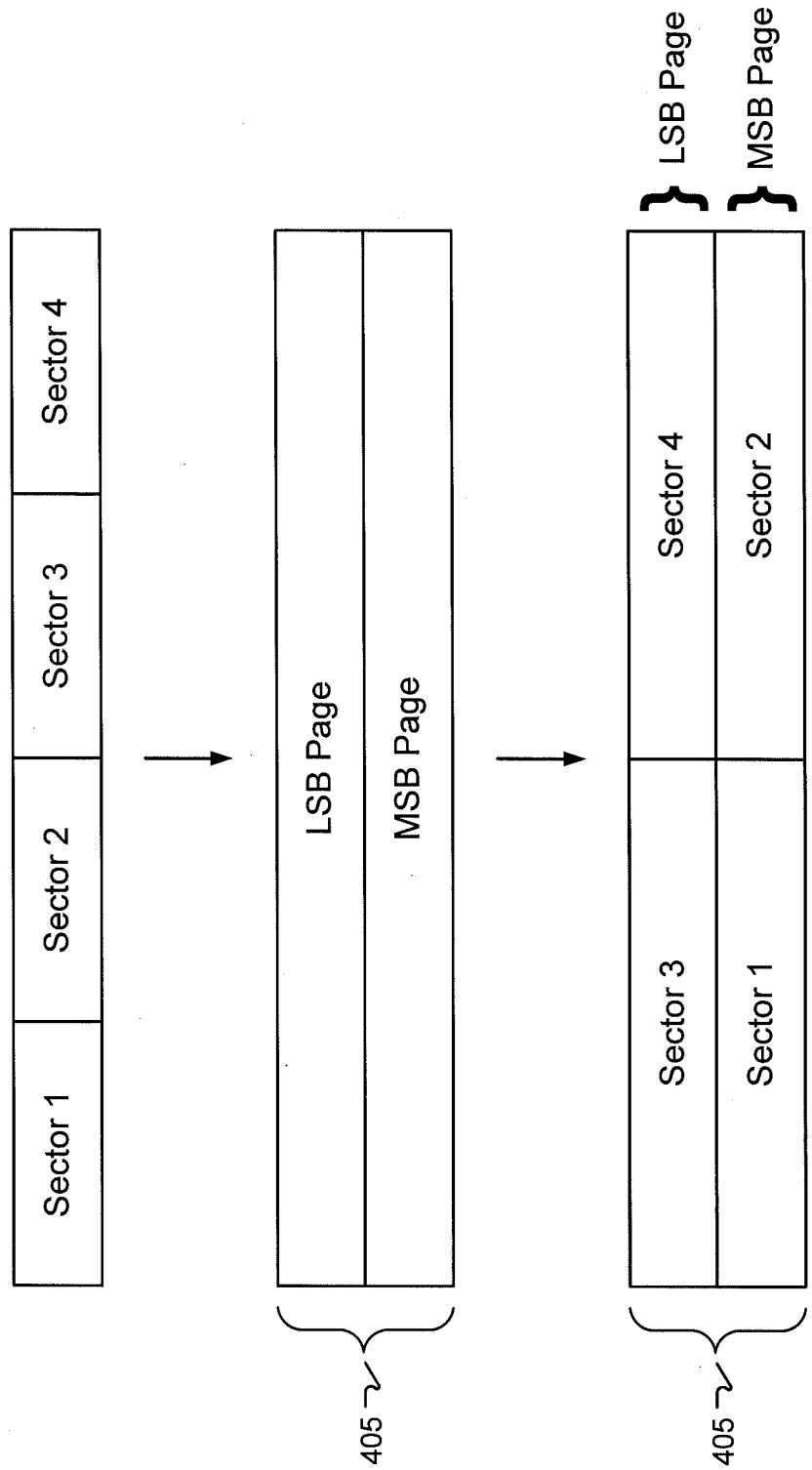
Figure 5:
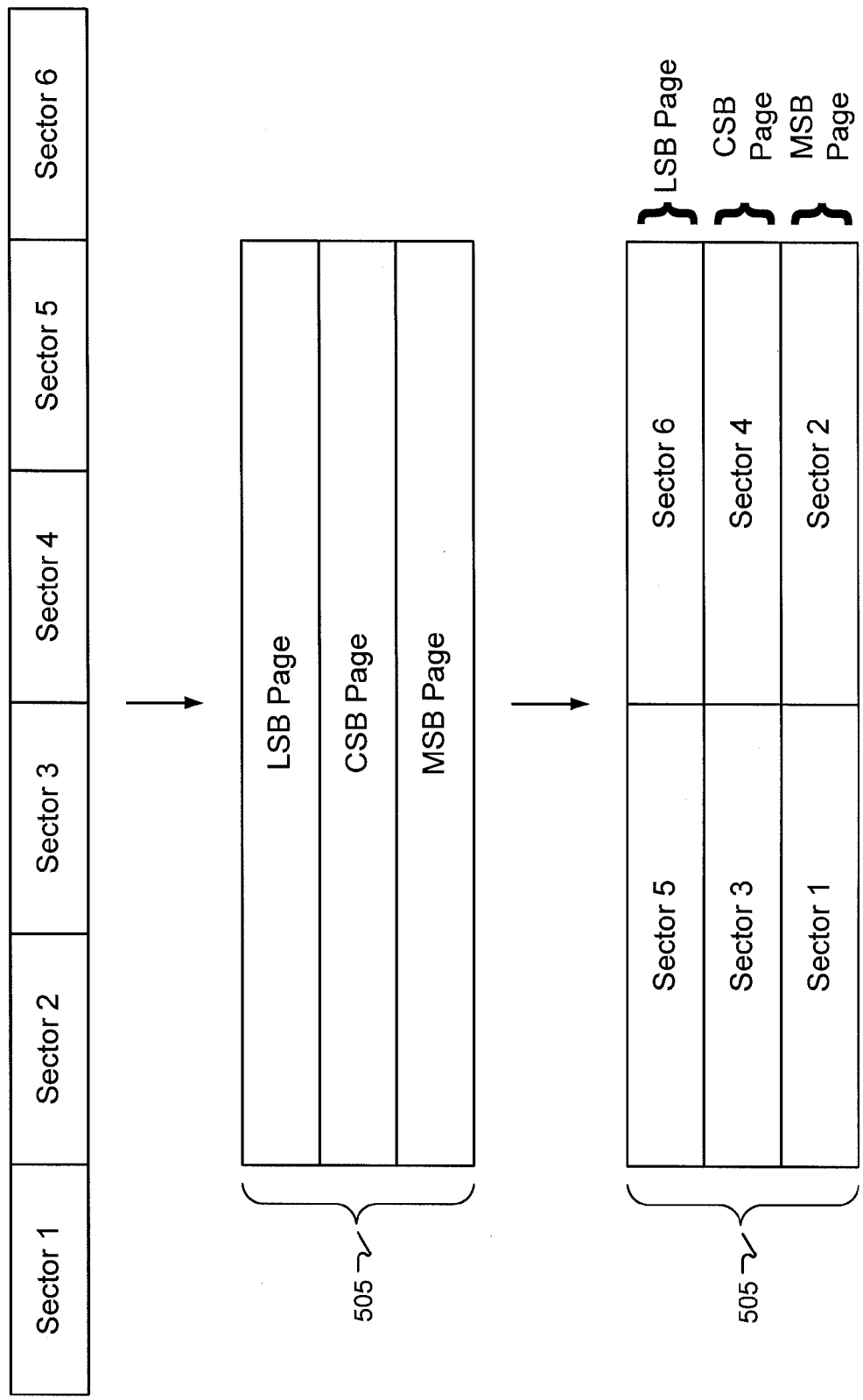
Figure 6:
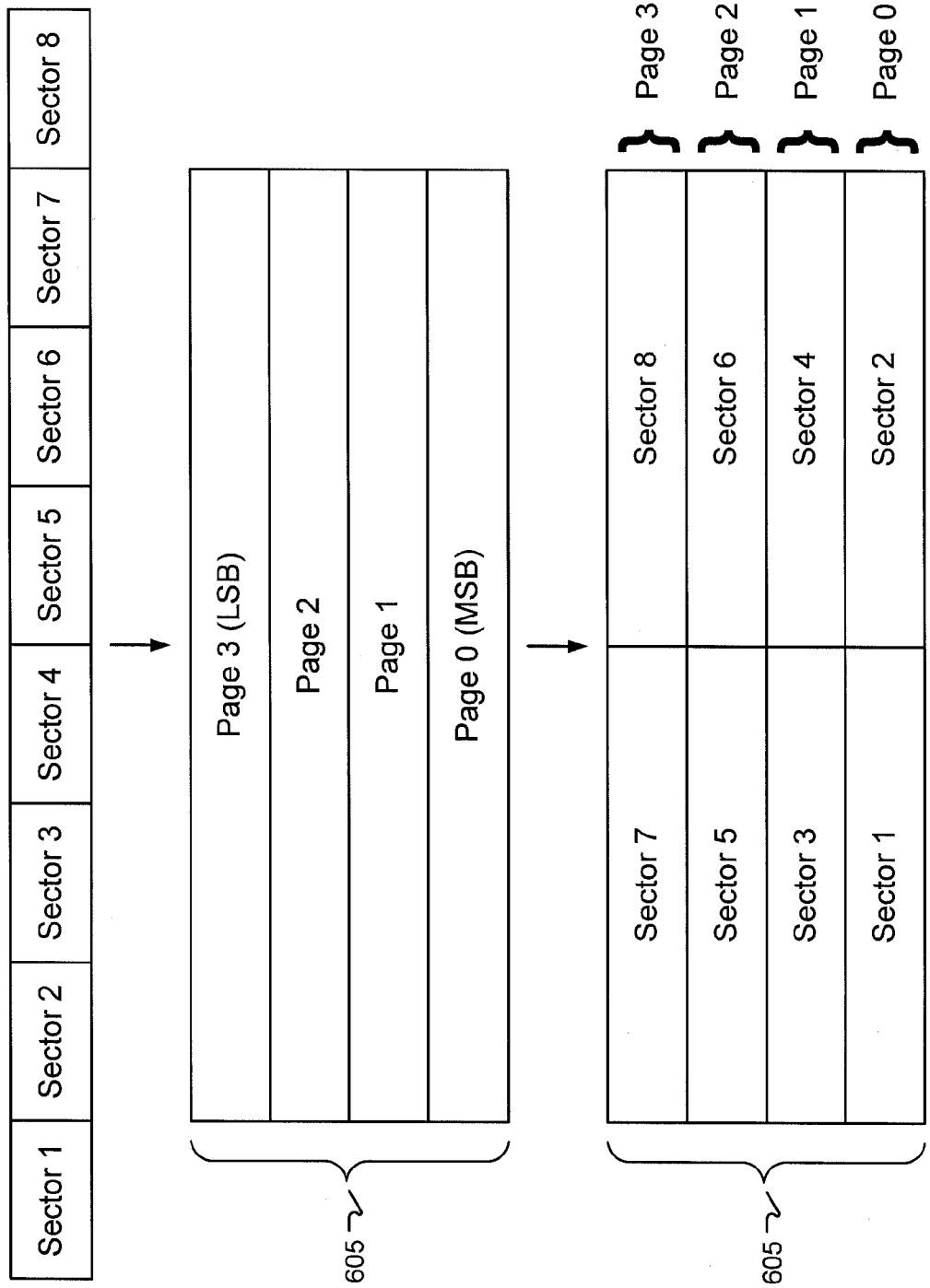

FIGS. 4, 5, and 6 show different examples of mapping data sectors to pages in non-volatile memory in which all bits of a data sector have the same significance.

Figure 7:
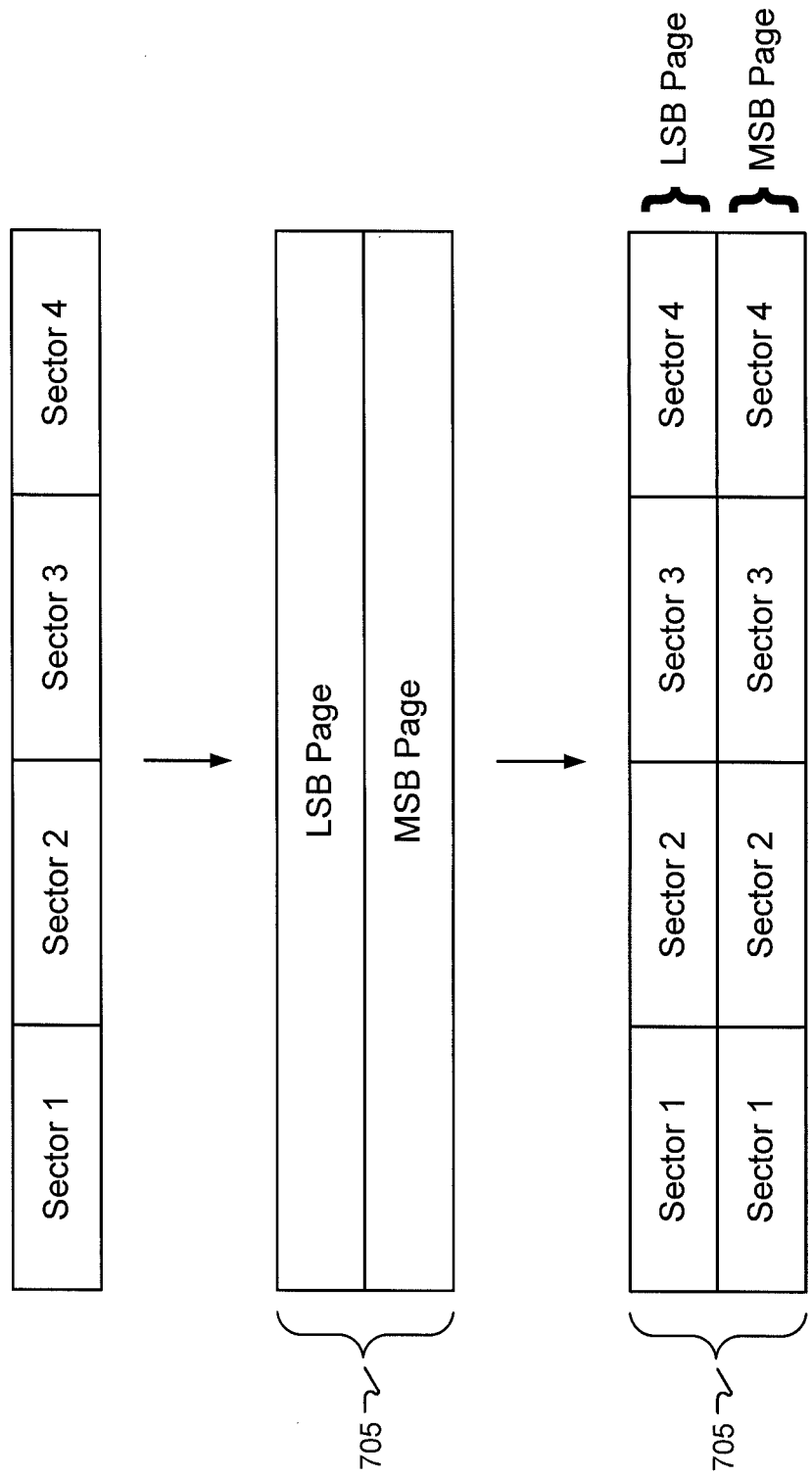
Figure 8:
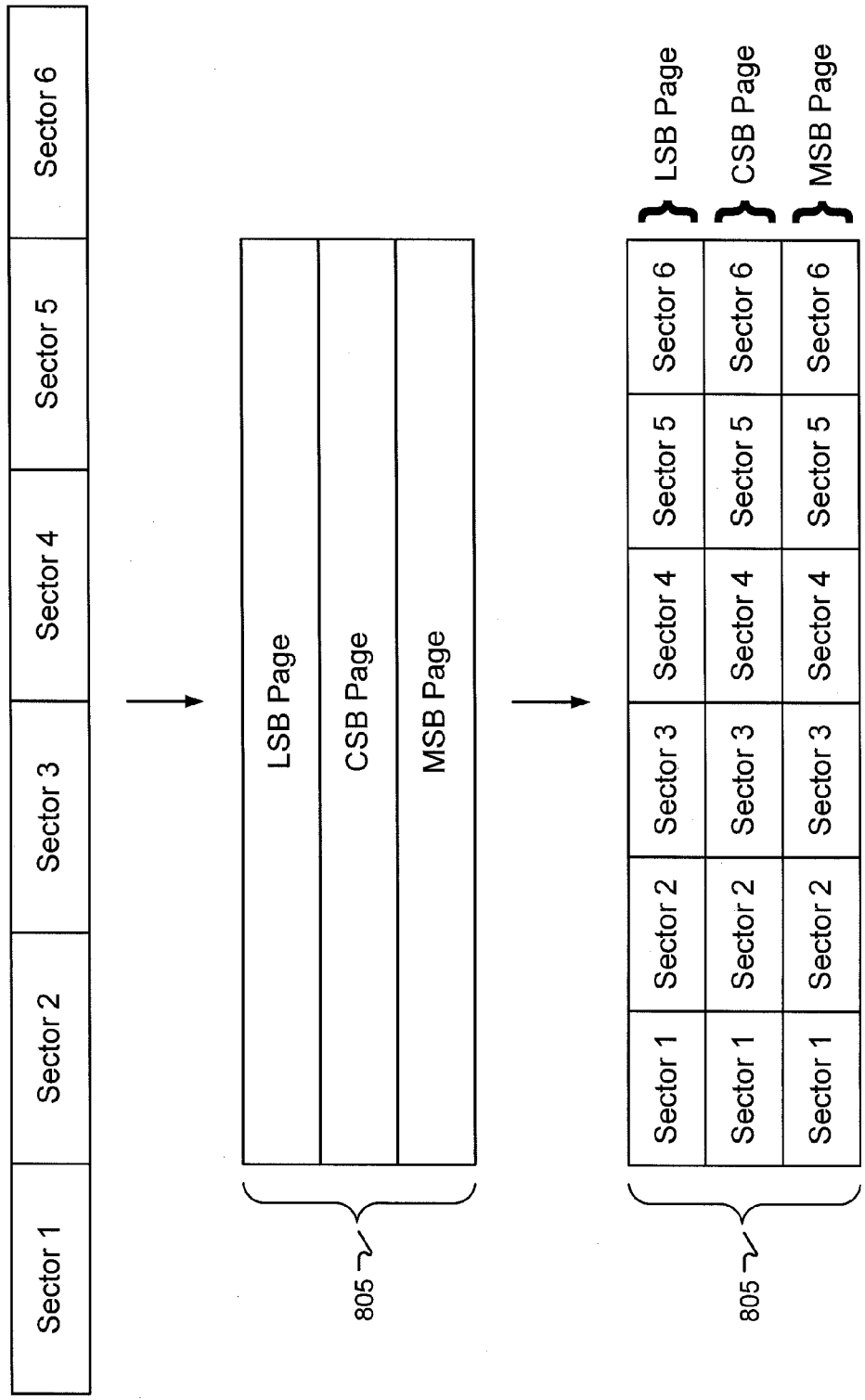
Figure 9:
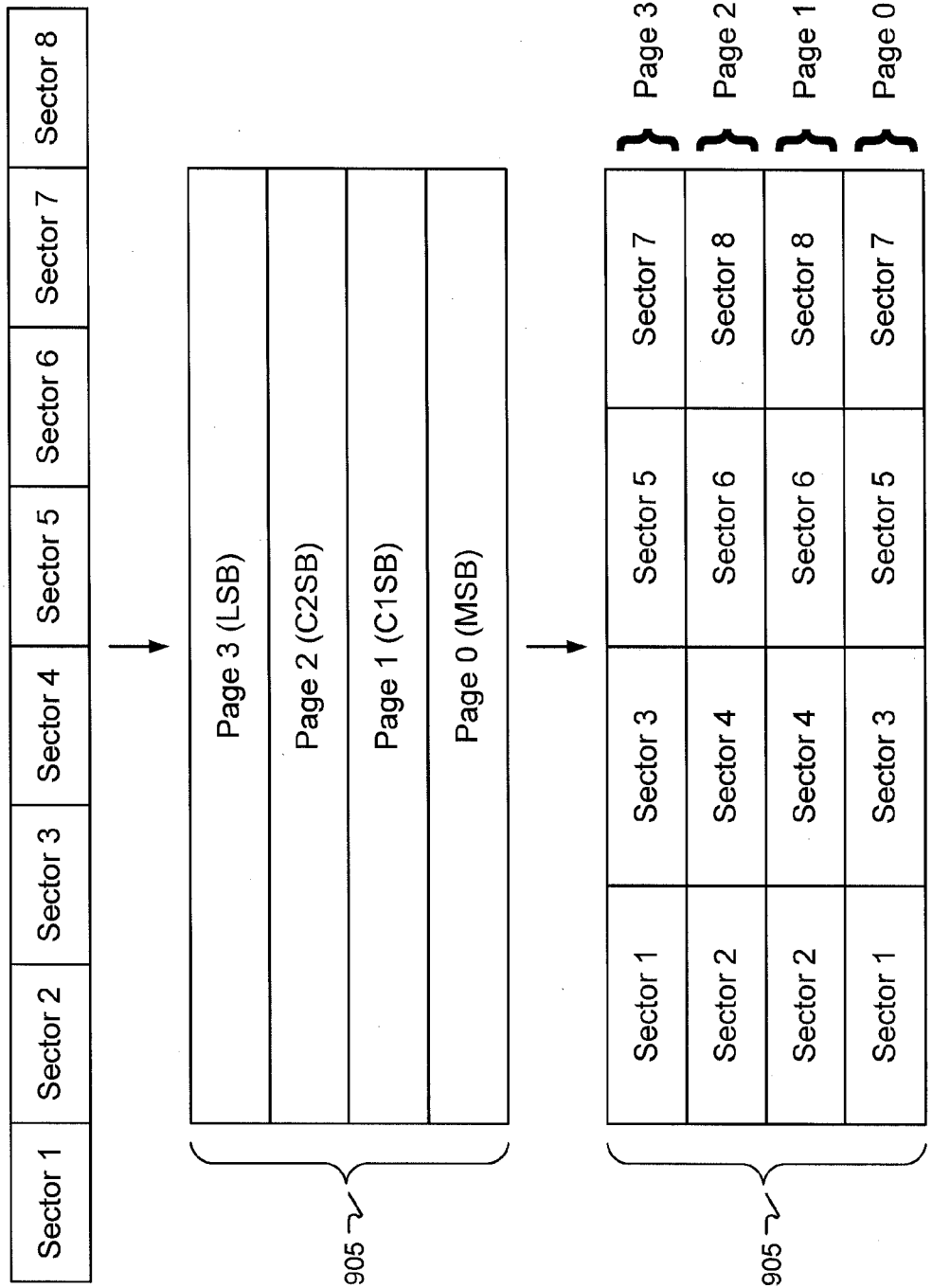

FIGS. 7, 8, and 9 show different examples of mapping data sectors to pages in non-volatile memory so that a data sector contains a mixture of bits of different significance.

Figure 10:
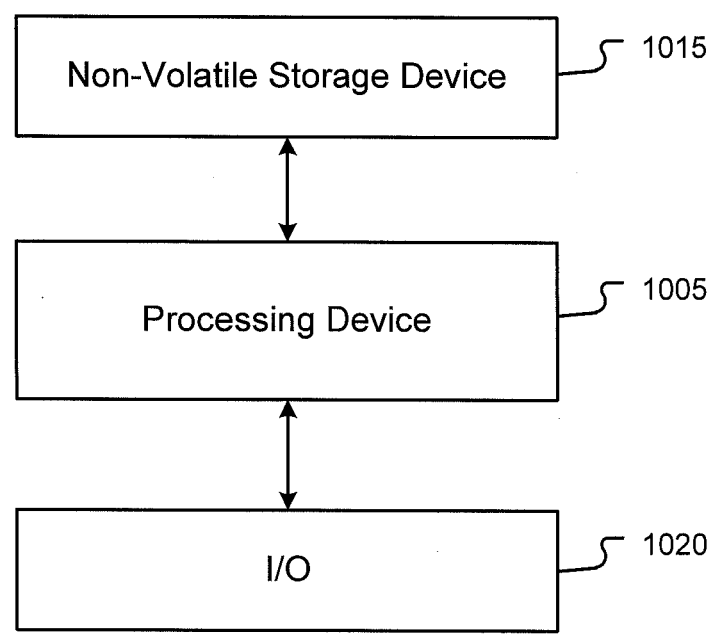
Figure 11:
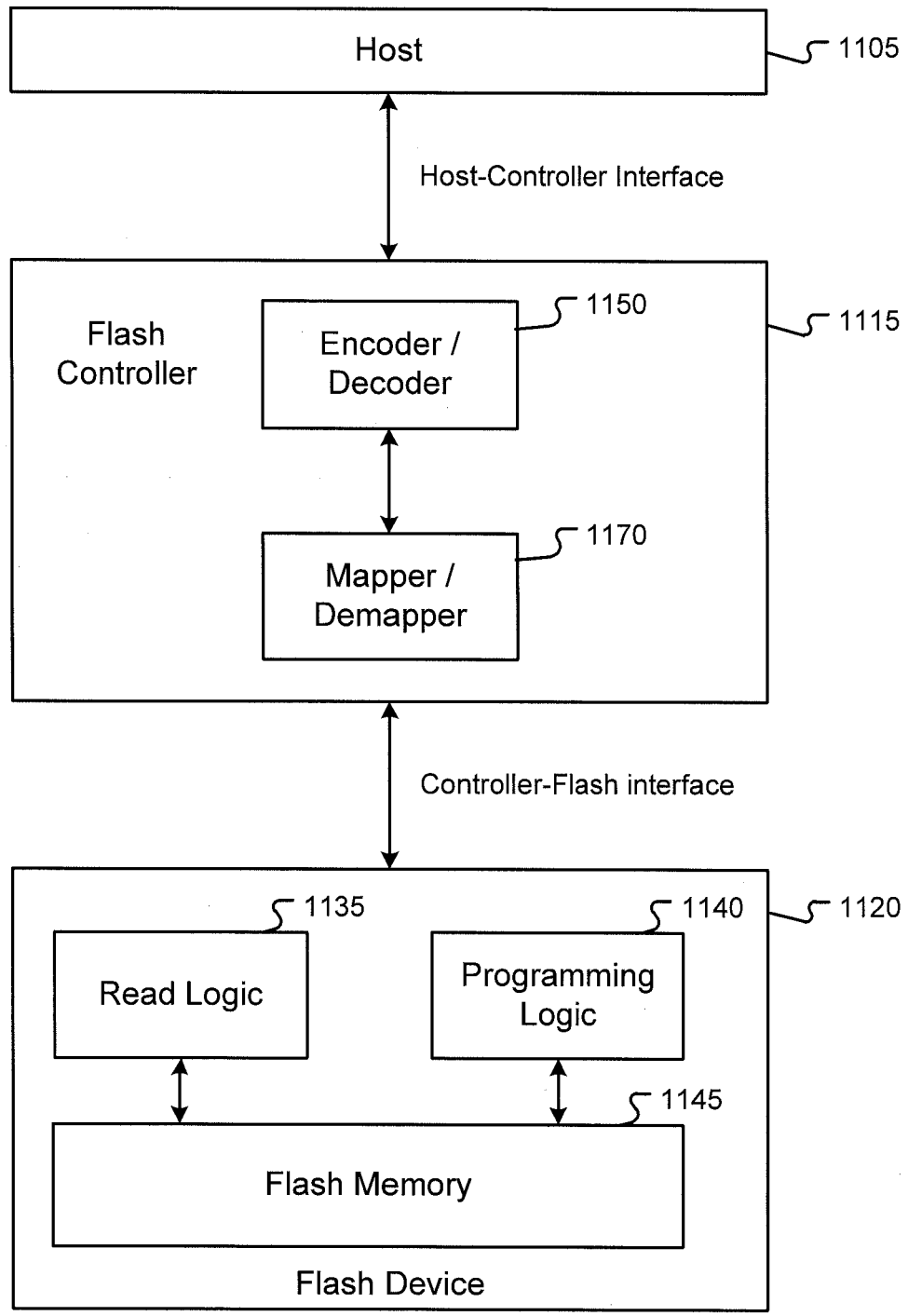

FIGS. 10 and 11 show different examples of systems with non-volatile memory that can perform one or more techniques described herein.

Figure 12:
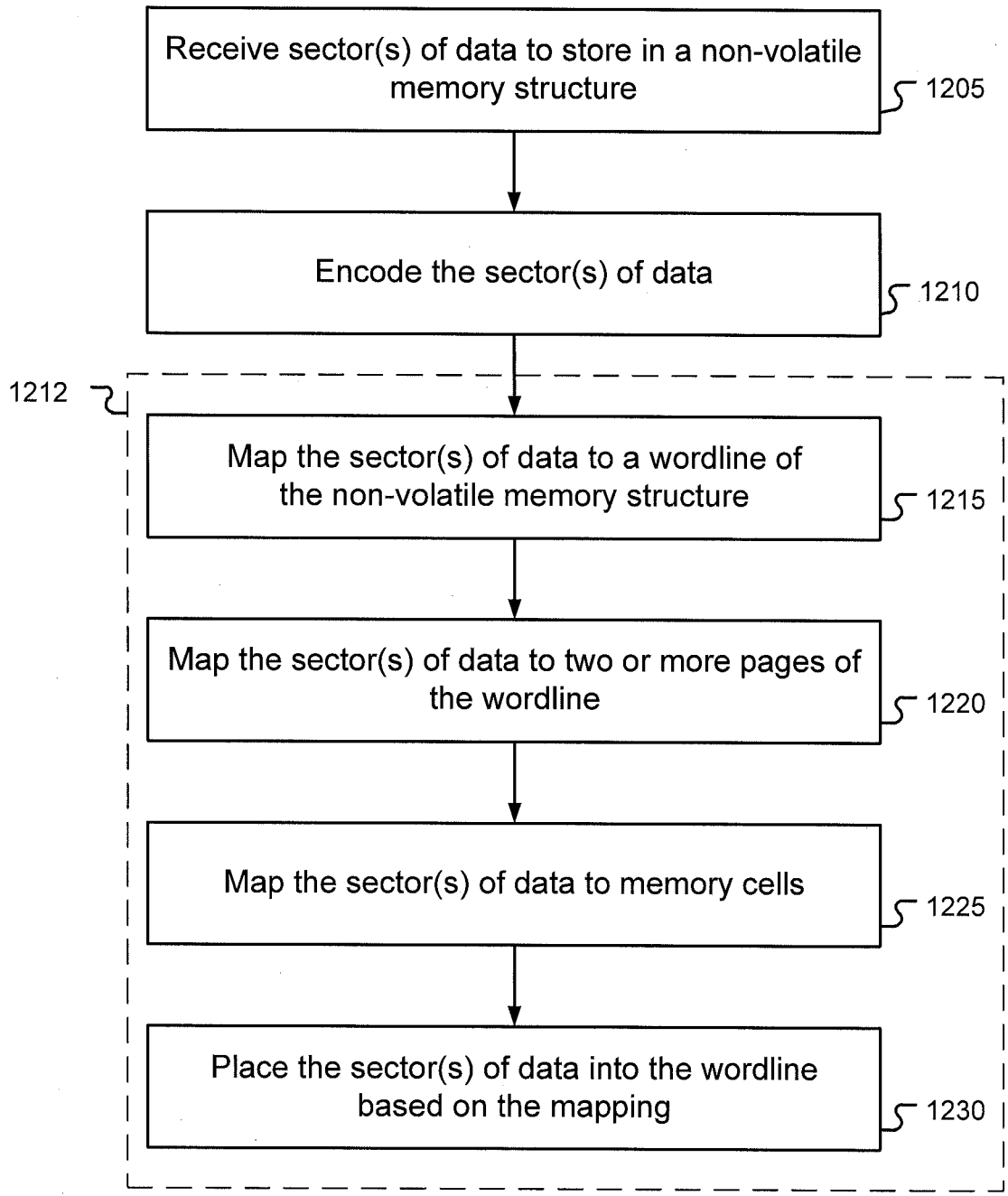

FIG. 12 shows an example of a process for mapping data sectors to pages in non-volatile memory.

Like reference symbols in the various drawings indicate like elements.

DETAILED DESCRIPTION

Figure 1:
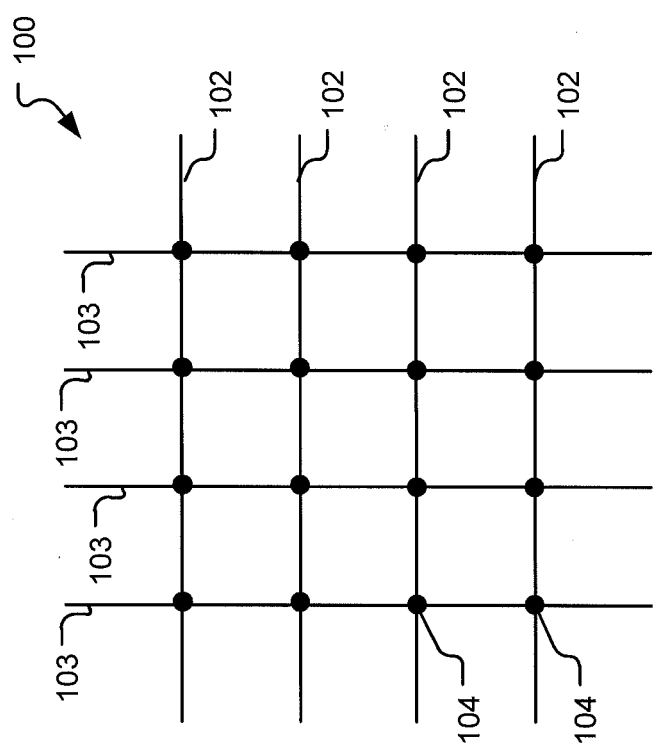
FIG. 1 shows an example of a layout of a non-volatile memory structure.

Memory devices can include a memory cell structure that includes multiple memory cells in an arrangement. For example, some flash memory devices can include flash cells organized in an arrangement such as an X-Y array. FIG. 1 shows an example of a layout of a non-volatile memory structure. The non-volatile memory structure 100 can include multiple memory cells 104, e.g., multi-level cells (MLCs), in an X-Y array arrangement. A memory cell 104 can include circuitry configured to store information. In some implementations, a non-volatile memory structure can include flash memory and controller logic, such as read logic and programming logic. The controller logic can use a bit line 103 and a wordline 102 to address an individual cell 104.

Non-volatile memory structures such as flash memory structures can store information in memory cells based on charge levels. For example, a memory cell 104 can store a charge (or lack thereof, e.g., a zero charge) that represents one of multiple logic states. With respect to a MLC, a state can indicate two or more bit values in two or more bit positions. For example, different logic states can be assigned to different logical values such as, in binary, logical 00, 01, 10, or 11.

In some implementations, an erase state is represented by logical 11. If a logical 11 value is to be stored in a flash cell such as a cell in an X-Y array, the voltage on a corresponding bit line is raised and a zero programming voltage is applied so as to not cause, or at least minimize, a voltage difference between a corresponding wordline and the corresponding bit line. Thus, the cell stays at an erase state. Otherwise, a voltage difference is set up between a corresponding wordline and the corresponding bit line to program the memory cell to a non-erased state. Different voltages can be used to program different states. For example, a controller can select a voltage from a look-up table based on a state that is to be written to a cell. In some implementations, a wordline can be associated with a control gate and a bit line can be associated with a drain and source of a floating gate transistor.

Figure 2:
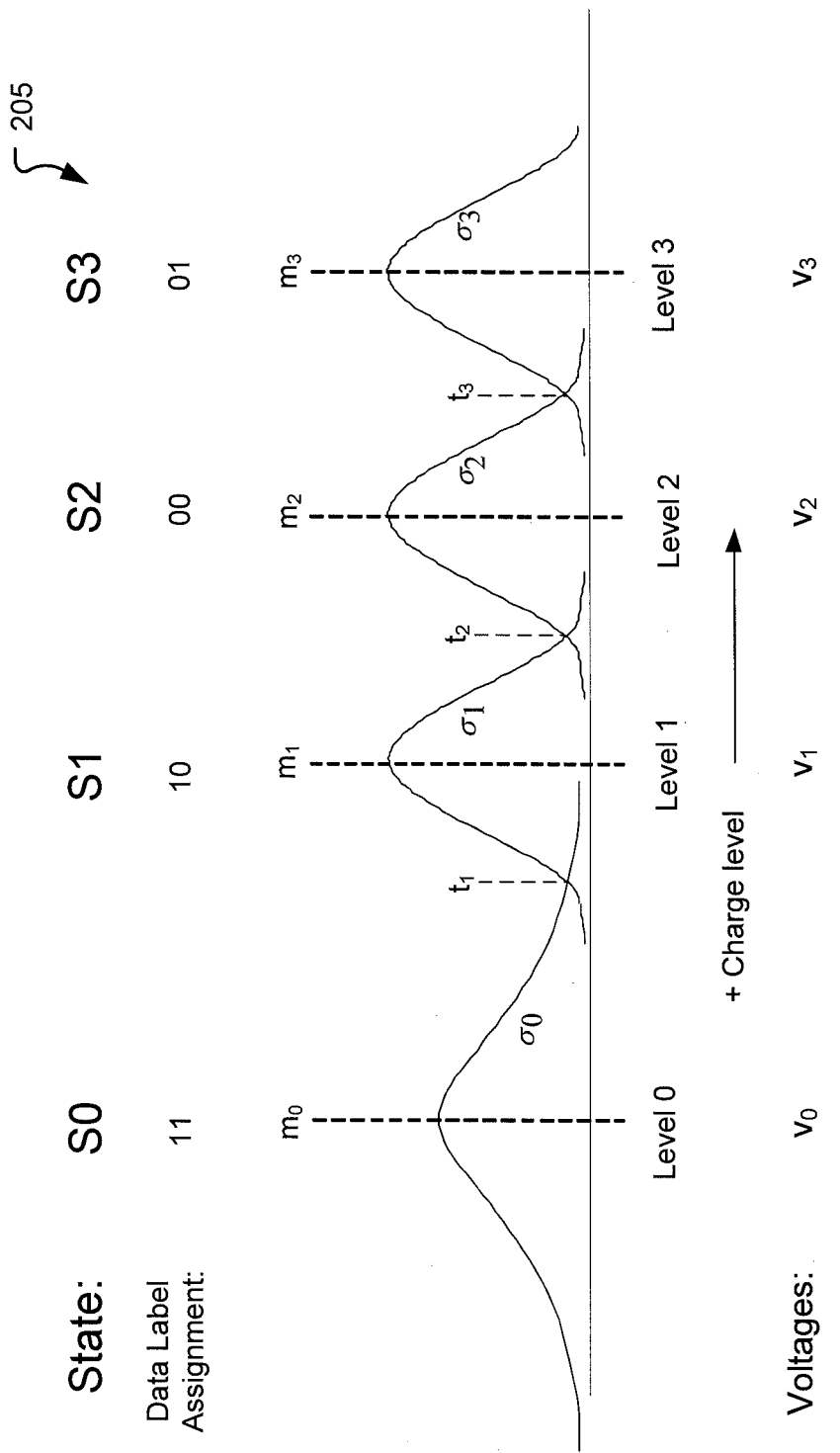
FIG. 2 shows an example of four states and associated threshold voltage distributions for a 2-bit memory cell.

FIG. 2 shows an example of four states and associated threshold voltage distributions for a 2-bit memory cell. In some implementations, the actual programmed amount of charges approximately follows a Gaussian distribution centered on a desired charge level. The variance of the distribution can be determined by a programming method and one or more physical properties of the memory cell. Likewise, the threshold voltage distributions of a memory cell can be Gaussian. The threshold voltage distributions can be referred to as level distributions. Four states and associated threshold voltage distributions are arranged on a graph 205 depicted by FIG. 2. The four level distributions have mean values of $m_0$, $m_1$, $m_2$, and $m_3$ and standard deviations of $\sigma_0$ $\sigma_1$, $\sigma_2$, and $\sigma_3$ respectively.

The 2-bit memory cell can store information corresponding to one of four states, e.g., S0, S1, S2, and S3. The four states are depicted by FIG. 2 with respective data label assignments of 11, 10, 00, and 01. In some implementations, a 2-bit memory cell can store information corresponding to information in a first bit position and information in a second bit position. For example, a 2-bit memory cell state can represent bit information including a most significant bit (MSB) and a least significant bit (LSB). As another example, a 3-bit memory cell state can represent bit information including a most significant bit (MSB), a central significant bit (CSB), and a least significant bit (LSB). As depicted in FIG. 2, the states and associated data label assignments are arranged in an ordering where each state, e.g., S0, S1, S2, and S3, differs by a single bit position with an adjacent state. This particular mapping of states to data label assignments shown in FIG. 2 is known as Gray code mapping. However, there are other possibilities for mapping the charge distribution to a bit pattern. The mapping of the charge distribution to a bit pattern determines how data is programmed and read from a memory cell.

The four states are associated with four level distributions. The four level distributions depicted are associated with four different levels of charge that may be stored in the 2-bit memory cell. Each level distribution can have its own mean and variance. As depicted by FIG. 2, the intersections of the four charge levels, e.g., level 0, level 1, level 2, and level 3, define three detection thresholds, e.g., $t_1$, $t_2$, and $t_3$, respectively. The three detection thresholds are located where curves of two adjacent level distributions intersect.

Writing data to the 2-bit memory cell can include using the means, e.g., $m_0$, $m_1$, $m_2$, and $m_3$, of the level distributions of the 2-bit memory cell. For example, if the controller is operated to store a level 1 amount of charge in the memory cell, the controller can use the second mean value $m_1$ to program the memory cell. By targeting an $m_1$ amount of charge to be stored in the memory cell, where $m_1$ is located at the peak of a Gaussian curve, an error can be minimized. In some implementations, one or more mean values of the level distributions are required during a write operation to the memory cell to accurately target an amount of charge to be programmed into the memory cell. However, it is often difficult to precisely program a MLC with a desired amount of charge. Further, a measurement of a cell's charge level can differ from the value that was used to program the cell. For example, a cell's charge level can gradually deteriorate in the course of repeated read operations.

Reading data from the 2-bit memory cell can include using the detection thresholds of the 2-bit memory cell because the amount of charge stored in the memory cell cannot be measured directly. In some implementations, statistical analysis is used to interpret a measured cell charge level. In some implementations, the detection thresholds, e.g., $t_1$, $t_2$, and $t_3$, are used to read data from the memory cells. For example, one or more detection thresholds are used during a read operation of a 2-bit memory cell to determine whether the charge stored in the memory cell is at level 0, level 1, level 2, or level 3.

For example, to determine whether the charge stored in a multi-level memory cell is in level 0 during a read operation, the value of the first detection threshold $t_1$ can be used. Based on the value of $t_1$, a memory controller can determine whether a charge stored (including potentially a stored zero charge) in the memory cell is less than $t_1$ in order to determine whether the stored charge is at level 0. Similarly, to determine whether the charge stored in the memory cell is at level 1, a memory controller can determine whether the charge stored in the memory cell is between $t_1$ and $t_2$.

The bits of a memory cell can be written and read out independently when Gray code mapping is used to map states to data label assignments. Specifically, for the 2-bit memory cell depicted by FIG. 2, the MSB may be written independently of the LSB. A memory controller can program a memory cell when it receives the MSB, without having to wait for the LSB. When the memory controller receives a 1 to be programmed to the MSB, the controller stores a level 0 amount of charge in the memory cell corresponding to state S0. When the memory controller receives a 0 to be programmed to the MSB, the controller stores a level 2 amount of charge in the memory cell corresponding to state S2.

After programming the MSB, the memory controller can program the LSB. When the MSB has been programmed with a 1 (e.g., the memory cell is storing a level 0 amount of charge corresponding to state S0) and the memory controller receives a 1 to be programmed to the LSB, the amount of charge in the memory cell can remain at level 0. If the memory controller receives a 0 to be programmed to the LSB, the memory controller increases the charge in the memory cell to level 1 corresponding to state S1. When the MSB has been programmed with a 0 (e.g., the memory cell is storing a level 2 amount of charge corresponding to state S2) and the memory controller receives a 0 to be programmed to the LSB, the amount of charge in the memory cell can remain at level 2. If the memory controller receives a 1 to be programmed to the LSB, the memory controller increases the charge in the memory cell to level 3 corresponding to state S3.

For the 2-bit memory cell depicted by FIG. 2, the MSB may be read independently of the LSB. To determine whether the MSB is a 1 or a 0, the value of the detection threshold $t_2$ can be used. Based on the value of $t_2$, a memory controller can determine whether the MSB is a 1 or a 0. Reading the MSB does not give any information about the value of the LSB. Likewise, the LSB may be read independently of the MSB. To determine whether the LSB is a 1 or a 0, the values at detection thresholds $t_1$ and $t_3$ are used. Based on the values of $t_1$ and $t_3$, a memory controller can determine whether the LSB is a 1 or 0. Reading the LSB does not give any information about the value of the MSB.

For a memory cell with data bits 10 stored, the nominal voltage is $v_1$, as shown in FIG. 2. However, due to disturbances and noise, a measured voltage can become closer to $v_0$ or $v_2$ compared to the nominal voltage $v_1$, which may cause a detection error. Specifically, the LSB bit may be read erroneously if a measured voltage is closer to $v_0$ than $v_1$, or the MSB bit may be read erroneously if a measured voltage is closer to $v_2$ than $v_1$.

Left uncompensated, errors that affect a cell's charge level may have a non-uniform impact on bit values that are in different positions. A memory system can use one or more techniques to minimize a system bit error probability. In some implementations, a memory system can use a state encoding technique that uses Gray codes where neighboring states differ by a single bit, e.g., 00, 01, 10, 11. In some implementations, a memory system can use nominal threshold values where a crossing probability of any neighboring state is equal. A crossing probability is the likelihood that, despite being programmed to represent $S_i$, a read operation on a cell returns an adjacent state, e.g., $S_{i+1}$ or $S_{i-1}$.

However, some techniques for minimizing an overall system probability of bit error may produce different error probabilities for different data pages. A non-volatile memory device such as flash memory devices can organize data in a bit-page-block hierarchy. For example, a minimum data unit that is to be read from or programmed into a NAND memory device can be a page, and a minimum data unit that is to be erased from a NAND memory can be a block. In a SLC that can store one bit of information, a page of data resides in the cells from the same wordline. In a MLC that can store more than one bit of information, the data stored in the cells from the same wordline can be subdivided into two or more pages. In general, for N-bits per cell flash, the data in the same wordline are grouped into N pages. For example, in a 2-bits per cell flash, the data residing in the cells from a wordline are grouped into two pages. In a 3-bits per cell flash, the data residing in the cells from a wordline are grouped into three pages. A flash device implementation can group bits associated with two or more cells that have the same significance into the same page. For example, for 2-bits per cell, the most significant bits (MSBs) from the cells of a wordline form a first page, whereas the least significant bits (LSBs) from the same wordline of cells form a second page. For 3-bits per cell, the most significant bits (MSBs) from the cells of a wordline form a first page, the central significant bits (CSBs) from the same wordline of cells form a second page, and the least significant bits (LSBs) from the same wordline of cells form a third page.

Figure 3:
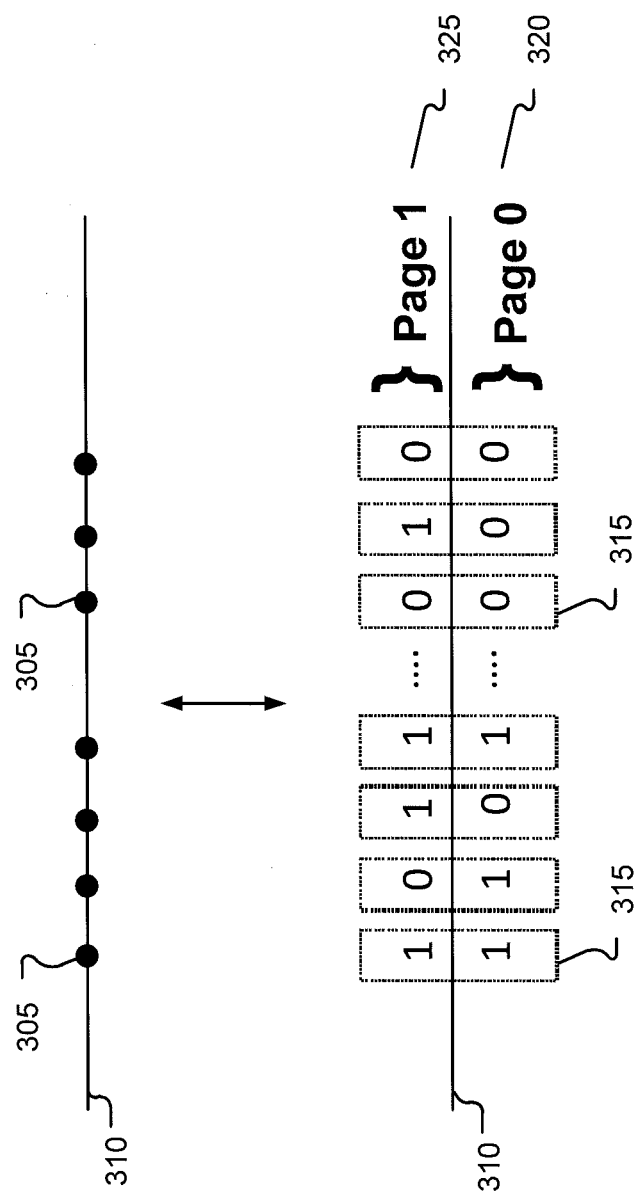
FIG. 3 shows an example of a two page layout for a multi-level cell structure.

FIG. 3 shows an example of a two page layout for a MLC structure. In this example, MLCs 305 that are associated with the same wordline 310 are grouped into two pages 320, 325. MLCs 305 store information that represents states 315, respectively. A state 315 can be associated with two bits of data. A state 315 can be indicative of information that includes first bit information in a first bit position and second bit information in a second bit position. For example, a state 315 can correspond to a value for a MSB and a value for a LSB. The MSB values indicated by two or more states 315 can be grouped into a first page 325. The LSB values indicated by two or more states 315 can be grouped into a second page 320. In some implementations, read data include a page, such as a first page 325 or a second page 320. When Gray code is used to map the states to the bits of data, each page of the memory device can be read or programmed independently.

For two bits per cell with pages that are organized similar to the page structure depicted by FIG. 3 and a state encoding that is similar to the encoding depicted by FIG. 2, LSB pages may have an error probability almost twice as that of the MSB pages. The neighboring states S0 and S1 have identical MSBs, whereas the LSBs differ. Similarly, the neighboring states of S2 and S3 have identical MSBs, whereas the LSBs differ. In contrast, the neighboring states of S1 and S2 have identical LSBs, whereas the MSBs differ. Because more LSBs have the potential of differing during a read operation than MSBs, LSB pages may have an error probability almost twice as that of the MSB pages.

Let $P_e$ represent a probability of neighboring states crossing, e.g., probability of S0 crossing with S1. Non-neighboring states crossing is possible, however, the probability can be orders of magnitude lower than neighboring states crossing. In both S0, with probability ¼, and S1, with probability ¼, the MSB equals one, whereas the LSB equals zero or one. If in S0, since the neighboring state has MSB equal to one, crossing from S0 to S1 does not produce an error for the MSB. However, when crossing from S1 to S2, the MSB bit is in error. Therefore, the MSB error probability can be computed as $$P_{MSB} = \frac{1}{4}P_e + \frac{1}{4}P_e = \frac{1}{2}P_e.$$

On the other hand, the LSB error probability can be computed as $$P_{LSB} = \frac{1}{4}P_e + \frac{1}{4}P_e + \frac{1}{4}P_e + \frac{1}{4}P_e = P_e.$$

Consequently, $P_{LSB} = 2P_{MSB}$.

A non-uniform error distribution, e.g., $P_{LSB} \neq P_{MSB}$, can cause inefficiencies in a flash storage system design, in particular, in terms of data reliability. From the user perspective, a page, whether being a LSB page or a MSB page, is treated the same in the sense that it contains desired data. This is often true from a design perspective, where the error correction codes applied are often identical across all the data pages in a device for ease of design. The weakest pages (e.g., LSB pages in the previous example) may become a bottleneck and a predominant factor of data reliability and device life cycle. For the 2-bits per cell example, the device reliability is determined by $P_{LSB}$ rather than $P_{MSB}$ as that is a predominant factor in determining the data reliability and device life.

Creating a more uniform page error distribution can alleviate performance bottleneck caused by one or more types of pages, e.g., LSB pages. For example, a memory system can be constructed such that different types of data pages, e.g., a MSB data page and a LSB data page, experience the same probability of error. In some implementations, a memory system selects nominal threshold voltages that are associated with respective states such that at least two of the crossing-over probability of neighboring states is different and the resulting bit error rates for bits of different significance, e.g., MSB and LSB, in a memory cell are statistically similar or identical. This can reduce differences among error distributions of different types of pages. For example, a cell's programming voltages can be selected to reduce differences among bit error rates of individual bit positions. Based on such programming voltages, errors that affect a cell's charge level may have a more uniform error distribution on bit values that are stored in different positions. Data stored in physical pages thus behave statistically similar or identical in terms of bit error rate, regardless of a bit significance of a page, e.g., a MSB page or a LSB page. A more uniform error distribution can increase the performance of a non-volatile memory device. Systems and techniques for selecting cell programming voltages to reduce differences among bit error rates are described in detail in U.S. application Ser. No. 12/842,724, filed Jul. 23, 2010, and entitled "Non-volatile Memory Devices Having Uniform Error Distributions Among Pages," the entire contents of which are hereby incorporated by reference.

A data processing device or host device, such as a digital media player, digital camera, personal data assistant (PDA), mobile phone, computer, or embedded device, can include a non-volatile storage device. A processing device can read from and/or write to a non-volatile storage device. A non-volatile storage device can obtain data from a host, e.g., a data processing device, and can store the data to one or more data areas in a non-volatile memory structure. A non-volatile storage device can read data from one or more data areas in a non-volatile memory structure and can send data to a device, e.g., a data processing device. Non-volatile storage devices can employ page or wordline level access techniques. In page level access, a page is the minimum unit that can be written to or read from the non-volatile memory structure. Pages can be written and read independently from each other. In wordline level access, a wordline is the minimum unit that can be written to or read from the non-volatile memory structure.

In some implementations, a processing device can access a non-volatile storage device based on a data segment. For example, a processing device can issue read and write commands to a non-volatile storage device in terms of a data segment. An example of a data segment is a data sector. A data sector can include a fixed amount of data, e.g., a fixed number of bits or bytes. In some implementations, a processing device can write data such as a logical data sector to a non-volatile storage device, and in turn, the non-volatile storage device can write data to a physical data sector, e.g., a grouping of memory cells. Likewise, a processing device can issue a command to read a data sector from the non-volatile storage device.

A page of a multi-page memory structure can be any size and can store any number of data sectors and/or a portion of a data sector. In some implementations, each page of a multi-page memory structure is a multiple of the size of the data sector. For example, each page can store a fixed number of sectors, e.g., two sectors per page. However, a page need not be a multiple of the size of the data sector. For example, a page can store data in addition to a data sector from a processing device, such as meta data and/or parity bits.

In page level access, a non-volatile storage device combines sectors of information, e.g., two sectors of information, to write each page to a non-volatile memory structure. Each time a data sector is read from the non-volatile memory structure, a full page is read that contains the desired data sector. In wordline level access, a non-volatile storage device combines sectors of information, e.g, four sectors of information, to write each wordline to a non-volatile memory structure. Each time a data sector is read from the non-volatile memory structure, a full wordline is read that contains the desired data sector. The non-volatile memory structure identifies the page or wordline in which to read or write a data sector using mapping techniques.

FIGS. 4, 5, and 6 show different examples of a mapping of data sectors to pages in non-volatile memory in which all bits of a data sector have the same significance. FIG. 4 depicts a 2-bits per cell device in which there are four data sectors, e.g., Sector 1, Sector 2, Sector 3, and Sector 4. Sector 1 and Sector 2 are mapped to a MSB Page of a wordline 405, and Sector 3 and Sector 4 are mapped to a LSB Page of the wordline 405. FIG. 5 depicts a 3-bits per cell device in which there are six data sectors. Sector 1 and Sector 2 are mapped to a MSB Page of a wordline 505, Sector 3 and Sector 4 are mapped to a CSB Page of the wordline 505, and Sector 5 and Sector 6 are mapped to a LSB Page of the wordline 505. FIG. 6 depicts a 4-bits per cell device in which there are eight data sectors. Sector 1 and Sector 2 are mapped to Page 0 of a wordline 605, Sector 3 and Sector 4 are mapped to Page 1 of the wordline 605, Sector 5 and Sector 6 are mapped to Page 2 of the wordline 605, and Sector 7 and Sector 8 are mapped to Page 3 of the wordline 605.

In the examples depicted by FIGS. 4, 5, and 6, the size of a page is twice the size of a sector, and two sectors are mapped to a page. This mapping technique results in all bits in a sector having the same significance because all of the bits of a sector are from the same type of page. In memory systems where different types of pages have different error probabilities, a sector from one type of page may have a different error probability than a sector from a different type of page. For example, in a 2-bit per cell device, LSB pages may have an error probability almost twice as that of MSB pages. Thus, in the mapping technique for a 2-bit per cell device as depicted by FIG. 4, Sector 3 and Sector 4 may each have an error probability almost twice as that of Sector 1 or Sector 2.

In a 3-bit per cell device where all bits of a data sector have the same significance, the probabilities of bit error for a sector having only MSBs, a sector having only CSBs, and a sector having only LSBs are $$P_{S(MSB)} = \frac{1}{4}P_e, P_{S(CSB)} = \frac{1}{2}P_e, \text{ and } P_{S(LSB)} = P_e,$$

respectively.

Consequently, $P_{S(LSB)}=2P_{S(CSB)}=4P_{S(MSB)}$. LSB pages may have an error probability almost twice as that of CSB pages, and almost four times as that of MSB pages. Thus, in the mapping technique for a 3-bit per cell device as depicted by FIG. 5, Sector 5 and Sector 6 may each have an error probability almost twice as that of Sector 3 or Sector 4, and almost four times as that of Sector 1 or Sector 2. A probability of bit error for a sector is therefore dominated by the probability of bit error for a LSB page.

A non-uniform sector error distribution, e.g., $P_{S(LSB)} \neq P_{S(CSB)} \neq P_{S(MSB)}$, and cause inefficiencies in a flash storage system design, in particular, in terms of data reliability. Creating a more uniform sector error distribution can alleviate inefficiencies caused by one or more types of pages, e.g., LSB pages. For example, a memory system can be constructed such that all data sectors experience the same probability of error. In some implementations, a memory system maps a sector to non-volatile memory so that the sector contains a mixture of bits of different significance to reduce differences among bit error rates of individual sectors of data. In some implementations, a memory system combines the techniques of mapping a sector to non-volatile memory so that the sector contains a mixture of bits of different significance with the techniques for selecting cell programming voltages described in detail in U.S. application Ser. No. 12/842,724, filed Jul. 23, 2010, and entitled "Non-volatile Memory Devices Having Uniform Error Distributions Among Pages," to reduce differences among bit error rates.

FIGS. 7, 8, and 9 show different examples of a mapping of data sectors to pages in non-volatile memory so that a data sector contains a mixture of bits of different significance. FIG. 7 depicts a 2-bits per cell device in which there are four data sectors, e.g., Sector 1, Sector 2, Sector 3, and Sector 4. For this example, a sector can include 8 bytes of data, a page can include 16 bytes of data, and a wordline can include 32 bytes of data. In this example, the length of a wordline is a multiple of the page length, and the page length is a multiple of the sector length. However, other wordline lengths, page lengths, and sector lengths are possible. For example, a sector can include 8 bytes of data, a page can include 4 bytes of data, and a wordline can include 8 bytes of data. In such a case, a wordline can store one sector of data, where the sector is divided between the two pages of the wordline.

In FIG. 7, each of the four data sectors are mapped to ¼ of a MSB Page and ¼ of a LSB page of a wordline 705. A sector can include a sequence of consecutive bits. A portion of the sequence of bits of a sector is mapped to a MSB Page, and another portion of the sequence of bits of the sector is mapped to a LSB Page. For example, for a sector that includes 8 bytes of data, 4 bytes of the sector can be mapped to the LSB Page of wordline 705, and the other 4 bytes of the sector can be mapped to the MSB Page of wordline 705. FIG. 7 shows a sector being divided equally where each page of the wordline 705 stores an equal amount of data from a sector. However, other configurations are possible where, for example, a MSB Page may store more data from a sector than a LSB Page, or vice versa. FIG. 7 shows the sectors being mapped to the wordline 705 in a linear configuration where, for example, a sector is aligned in the LSB Page and the MSB Page. However, other configurations are possible where a sector is not aligned in the LSB and MSB Pages. The sectors are depicted in FIG. 7 as being mapped to the wordline 705 in consecutive numerical order. However, other configurations are possible.

A sector can be mapped to a MSB Page and a LSB Page by, for example, mapping the first 4 bytes to the MSB Page and the second 4 bytes to the LSB Page. Alternatively, a sector can be mapped to a MSB Page and a LSB Page by interleaving the bits or bytes of data into the wordline 705. For example, the odd bits, e.g., bits 1, 3, 5, 7, etc., of the sector are mapped to a MSB Page, and the even bits, e.g., bits 2, 4, 5, 8, etc., of the sector are mapped to a LSB Page. As another example, the odd bytes of a sector can be mapped to a MSB Page, and the even bytes of the sector can be mapped to a LSB Page. Other implementations for mapping the bits and bytes of a sector to pages of different significance are possible.

FIG. 8 depicts a 3-bits per cell device in which there are six data sectors. A first portion of the sequence of bits of a sector is mapped to a MSB Page, a second portion of the sequence of bits of the sector is mapped to a CSB Page, and a third portion of the sequence of bits is mapped to a LSB Page. In FIG. 8, each of the six data sectors are mapped to ⅙ of a MSB page, ⅙ of a CSB Page, and ⅙ of a LSB Page of a wordline 805. For this example, a sector can include 24 bytes of data, a page can include 48 bytes of data, and a wordline can include 144 bytes of data. 8 bytes of the sector can be mapped to the MSB Page of wordline 805, 8 bytes of the sector can be mapped to the CSB Page of wordline 805, and 8 bytes of the sector can be mapped to the LSB Page of wordline 805. FIG. 8 shows a sector being divided equally where each page of the wordline 805 stores an equal amount of data from a sector. However, other configurations are possible where, for example, one of the three pages may store more data from a sector than the other two pages. FIG. 8 shows the sectors being mapped to the wordline 805 in a linear configuration where, for example, a sector is aligned in the MSB Page, the CSB Page, and the LSB Page. However, other configurations are possible where a sector is not aligned in the MSB, CSB, and LSB Pages. The sectors are depicted in FIG. 8 as being mapped to the wordline 805 in consecutive numerical order. However, other configurations are possible.

A sector can be mapped to a MSB Page, a CSB Page, and a LSB Page by, for example, mapping the first 8 bytes to the MSB Page, the second 8 bytes to the CSB Page, and the third 8 bytes to the LSB Page. Alternatively, a sector can be mapped to a MSB Page and a LSB Page by interleaving the bits or bytes of data into the wordline 805. For example, every third bit of the sector can be mapped to a page. As another example, every third byte of a sector can be mapped to a page. Other implementations for mapping the bits of a sector to pages of different significance are possible.

FIG. 9 depicts a 4-bits per cell device in which there are eight data sectors. The eight sectors are mapped to a wordline 905 that includes four pages of different significance. For example, Page 0 can be a MSB page, Page 1 can be a C1SB page, Page 2 can be a C2SB page, and Page 3 can be a LSB page. The bits of a MSB page are of a different significance than the bits of a C1SB page, a C2SB page, and a LSB page. The bits of a C1SB page are of a different significance than the bits of a C2SB page and a LSB page. The bits of a C2SB page are of different significance than the bits of a LSB page.

Generally, the bits associated with a page are of a different significance than the bits associated with the other pages.

In FIG. 9, a first portion of the sequence of bits of a sector can be mapped to a page of a 4-page wordline, and a second portion of the sequence of bits of the sector can be mapped to another page of different significance of the 4-page wordline. For example, Sector 1, Sector 3, Sector 5, and Sector 7 are each mapped to ¼ of Page 0 and ¼ of Page 3 of a wordline 905. Sector 2, Sector 4, Sector 6, and Sector 8 are each mapped to ¼ of Page 1 and ¼ of Page 2 of the wordline 905. Other configurations are possible where, for example, a sector is mapped to ⅛ of each of the pages of the wordline 905 such that a sector includes bits from every page in the wordline, and thus includes bits of all significance. In general, a sector can have any combination of bits of different significance.

For the mapping depicted by FIG. 9, 4 bytes of an 8-byte sector can be mapped to a page, and the other 4 bytes of the 8-byte sector can be mapped to another page of different significance. For example, 4 bytes of Sector 1 is mapped to Page 0 of wordline 905, and the other 4 bytes of Sector 1 is mapped to Page 3 of wordline 905. Thus, Sector 1 can include MSBs and LSBs. 4 bytes of Sector 2 is mapped to Page 1 of wordline 905, and the other 4 bytes of Sector 2 is mapped to Page 2 of wordline 905. Thus, Sector 2 can include C1SBs and C2SBs. Sectors 3 to Sectors 8 are similarly mapped. However, other configurations are possible. For example, Sector 1 can be mapped to Page 1 and Page 2 of wordline 905, and Sector 2 can be mapped to Page 0 and Page 3 of wordline 905. As another example, Sector 1 can be mapped to Page 0 and Page 1, and Sector 2 can be mapped to Page 2 and Page 3.

FIG. 9 shows a sector being divided equally between two pages of a wordline 905. However, other configurations are possible where, for example, Page 0 may store more data from a sector than a Page 3, or vice versa. FIG. 9 shows the sectors being mapped to the wordline 905 in a linear configuration where, for example, a sector is aligned in Page 0 and Page 3. However, other configurations are possible where a sector is not aligned across two pages. The sectors are depicted in FIG. 9 as being mapped to the wordline 705 in order and according to odd and even sectors. However, other configurations are possible. For example, Sector 1, Sector 2, Sector 3, and Sector 4 can be mapped to Page 0 and Page 3 of wordline 905, while Sector 5, Sector 6, Sector 7, and Sector 8 can be mapped to Page 1 and Page 2 of wordline 905.

A sector can be mapped between two pages by, for example, mapping the first 8 bytes to a first page, and the second 8 bytes to a second page. Alternatively, a sector can be mapped between two pages by interleaving the bits or bytes of data between two pages of the wordline 905. For example, the odd bits, e.g., bits 1, 3, 5, 7, etc., of the sector are mapped to a first page, and the even bits, e.g., bits 2, 4, 5, 8, etc., of the sector are mapped to a second page. As another example, the odd bytes of a sector can be mapped to a first page, and the even bytes of the sector can be mapped to a second page. Other implementations for mapping the bits and bytes of a sector to pages of different significance are possible.

In a 3-bit per cell device where a data sector contains a mixture of bits of different significance, a sector can have an $\alpha$ fraction of bits from a MSB Page, a $\beta$ fraction of bits from a CSB Page, and a $1-\alpha-\beta$ fraction of bits from a LSB Page. The probability of bit error for a data sector can be computed as $$P_S = \alpha \cdot P_{MSB} + \beta \cdot P_{CSB} + (1 - \alpha - \beta) \cdot P_{LSB} =$$

$$\frac{\alpha}{4}P_e + \frac{\beta}{2}P_e + (1 - \alpha - \beta)P_e = \left(1 - \frac{3\alpha}{4} - \frac{\beta}{2}\right)P_e.$$

In the mapping of data sectors to pages in a 3-bit per cell device depicted by FIG. 8, a data sector has an equal number of bits from a MSB Page, a CSB Page, and a LSB Page to create a more uniform sector error distribution. Because a 3-bit per cell device has three different types of pages, a data sector can have ⅓ of the bits from a MSB Page, ⅓ of the bits from a CSB Page, and ⅓ of the bits from a LSB Page. The probability of bit error for a data sector of a 3-bit per cell device can be computed as $$P_S = \left(1 - \frac{3\alpha}{4} - \frac{\beta}{2}\right)P_e = \left(1 - \frac{3}{4} \cdot \frac{1}{3} - \frac{1}{2} \cdot \frac{1}{3}\right)P_e = \frac{7}{12}P_e.$$

Consequently, a mapping of data sectors to pages so that a data sector contains a mixture of bits of different significance can create a uniform error distribution among sectors.

FIG. 10 shows an example of a system with non-volatile memory that can perform one or more techniques described herein. A system can include a data processing device or host device with embedded or removable non-volatile memory. A data processing device, such as a digital media player, digital camera, personal data assistant (PDA), mobile phone, computer, or embedded device, can include one or more of: a non-volatile storage device 1015 that can include one or more flash memory structures, a processing device 1005, and an input/output (I/O) 1020 channel(s) and connection(s) such as video/audio/image input, text input, positioning input, or video/audio/image output. In some implementations, a processing device 1005 can include one or more processors or specialized processing logic. In some implementations, a processing device 1005 can include a memory that stores instructions to operate a processor to interact with a non-volatile storage device 1015.

Processing device 1005 can read from and/or write to the non-volatile storage device 1015. For example, data received from I/O 1020 can be stored on the non-volatile storage device 1015. In another example, content from a file retrieved from the non-volatile storage device 1015 can be digitally reproduced as output on I/O 1020. In some implementations, a removable unit can contain the non-volatile memory device 1015.

A non-volatile storage device 1015 can include processor electronics. In some implementations, a non-volatile storage device 1015 includes a controller that is communicatively coupled with one or more flash memory structures. Various examples of non-volatile storage device 1015 embodiments include implementations on a single integrated circuit die, on multiple dies within a single chip package, and on multiple dies in respective chips in a device package. In some implementations, a non-volatile storage device 1015 includes a flash controller and a flash device, e.g., a flash memory integrated circuit. A flash memory integrated circuit can be referred to as a flash chip.

A non-volatile storage device can use one or more techniques to map a data sector to pages of a wordline so that the data sector contains a mixture of bits of significance. In some implementations, a non-volatile storage device encodes data before storing data in a non-volatile memory structure. Encoding data can include using an error correcting code (ECC). In some implementations, encoding data includes using an error detection checksum. Various examples of techniques that a memory system can use to encode and map a data sector to a non-volatile memory structure include bit interleaved coded modulation (BICM), block coded modulation (BCM), and Trellis coded modulation (TCM). However, other suitable coding techniques known to those skilled in the art can be used to encode and decode data.

FIG. 11 shows another example of a system with non-volatile memory that can perform one or more techniques described herein. A host 1105 can access a flash device 1120 via a flash controller 1115. The host 1105 can communicate with the flash controller 1115 via a host-controller interface. The host 1105 can include a processing system. The flash controller 1115 can determine a mapping of data sectors to pages that provide uniform error distributions among sectors. The flash controller 1115 can encode the data of one or more sectors to form a codeword and map the codeword to the pages. The flash controller 1115 can send the codeword to the flash device 1120 via a controller-flash interface. The flash device 1120 can perform programming operations to write the codeword to flash memory 1145.

The flash controller 1115 can include an encoder/decoder 1150 and mapper/demapper 1170. The encoder/decoder 1150 can encode data of one or more sectors to form a codeword that can be written to the flash memory 1145, and decode a codeword to form data that can be read by the host 1105. The encoder/decoder 1150 can combine multiple sectors of data and encode the data from the multiple sectors together to form a codeword. For example, the encoder/decoder 1150 receives four sectors of data and encodes the four sectors of data by, for example, adding parity to the data to form a codeword. A codeword can contain more than one sector of data. In some implementations, a sector of data can be distributed between two or more codewords. For example, one codeword can contain two data sectors and a portion of a third data sector, and another codeword can contain the remaining portion of the third data sector and two other data sectors. The size of a codeword can be determined by the encoder/decoder 1150 based on the encoding technique used to generate the codeword.

The mapper/demapper 1170 can arrange multiple codewords to be written to a wordline of the flash memory 1145 using a memory map. The mapper/demapper 1170 can identify a wordline having a data sector requested by the host 1105 and can extract the requested sector from the wordline using a memory map.

The flash device 1120 can include read logic 1135, programming logic 1140, and flash memory 1145. The read logic 1135 can measure a charge level of one or more cells in the flash memory 1145 and interpret charge measurement data. In some implementations, the read logic 1135 can interpret charge measurement data based on one or more detection threshold values that are associated with respective target voltage values. The programming logic 1140 can write to a cell in the flash memory 1145 based on a target voltage value.

FIG. 12 shows an example of a process for mapping data sectors to pages in non-volatile memory. The process can be performed by a controller. At 1205, the controller receives a sector of data to store in a non-volatile memory structure. In some implementations, the controller can receive multiple sectors of data at one time to store in a non-volatile memory structure. A sector includes a fixed amount of data, e.g., a fixed number of bits or bytes. The sector can be a logical data sector received from a processing device.

At 1210, the controller encodes one or more sectors of data to create a codeword. The sectors of data can be encoded to protect the data from channel noise. In some implementations, encoding data can include using an error correcting code. In some implementations, encoding data can include using an error detection checksum. Data can be encoded using BCH code, LDPC code, RS code, or any other suitable error correcting code or combination of such codes.

At 1212, the controller writes the sector of data to the non-volatile memory structure. To write the sector of data, the controller can map the sector of data to a data area in the non-volatile memory structure. For example, the controller maps the sector of data to a wordline, maps the sector of data to two or more pages of the wordline, and maps the sector to memory cells of the pages. Based on the mapping, the controller places the sector of data into the data area of the non-volatile memory structure. The operation of writing the sector of data to a non-volatile memory structure will now be described.

At 1215, the controller maps the sector of data, e.g., the codeword, to a wordline of the non-volatile memory structure. In some implementations, a wordline is the minimum data unit for reading or programming data in a non-volatile memory structure. A wordline includes bits of different significance. A wordline can store one or more codewords. The data stored in the memory cells from the same wordline can be divided into two or more pages.

At 1220, the controller maps the sector of data to two or more pages of the wordline. A page of a word line includes bits associated with two or more memory cells, where those page bits have the same significance. At 1225, the controller maps the sector of data to the memory cells associated with the pages of the wordline. The controller can map the sector of data to memory cells that form a portion of a page or an entire page. The controller can map the sector of data to the pages in a linear, non-linear, or other configuration. In some implementations, the controller maps the sector of data to a portion of all of the pages of the wordline so that the sector includes bits of all significance. In some implementations, the controller maps the sector of data to a portion of two or more, but not all, pages of the wordline so that the sector includes bits of different significance but not bits of all significance.

At 1230, the controller places the sector of data into the wordline based on the mapping configuration. The controller can place the sector of data into the wordline by writing the data to the memory cells of the wordline. The controller can write data to a memory cell by affecting a charge of a memory cell. Affecting a charge of a memory cell can include using a programming voltage to increase a charge level of the cell. In some cases, affecting a charge of a memory cell can include using a programming voltage that is zero to maintain an erase state of a cell, e.g., adding zero charge to the cell. In some cases, affecting a charge of a memory cell can include using a programming voltage that is negative.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. An apparatus, comprising:
   a memory interface configured to connect with a plurality of multi-level memory cells; and
   a circuitry coupled with the memory interface, the circuitry configured to:
      map a first portion of a first sector of host data to a first page associated with the plurality of multi-level memory cells, wherein the first page is associated with bits of a first significance; and
      map a second portion of the first sector of host data to a second page associated with the plurality of multi-level memory cells, wherein the second page is associated with bits of a second significance,
      wherein the first portion of the first sector of host data excludes the second portion of the first sector of host data and the second portion of the first sector of host data excludes the first portion of the first sector of host data such that each of the first page and the second page contains different data from the first sector of host data.

2. The apparatus of claim 1, wherein the plurality of multi-level memory cells are flash cells.

3. The apparatus of claim 1, wherein the circuitry is further configured to:
   map a first portion of a second sector of host data to the first page; and
   map a second portion of the second sector of host data to the second page,
   wherein the first portion of the second sector of host data excludes the second portion of the second sector of host data and the second portion of the second sector of host data excludes the first portion of the second sector of host data such that each of the first page and the second page contains different data from the second sector of host data.

4. The apparatus of claim 3, wherein the first page is associated with most significant bits, the second page is associated with least significant bits, and the circuitry is further configured to:
   map a first portion of a third sector of host data to a third page associated with the plurality of multi-level memory cells, wherein the third page is associated with bits of a first central significance; and
   map a second portion of the third sector of host data to a fourth page, wherein the fourth page is associated with bits of a second central significance,
   wherein the first portion of the third sector of host data excludes the second portion of the third sector of host data and the second portion of the third sector of host data excludes the first portion of the third sector of host data such that each of the third page and the fourth page contains different data from the third sector of host data.

5. The apparatus of claim 1, wherein:
   the first page and the second page form a wordline; and
   the circuitry is configured to place the first portion of the first sector of host data and the second portion of the first sector of host data to the first page and the second page to thereby interleave the first sector of host data into the wordline.

6. The apparatus of claim 1, wherein the circuitry is configured to map the first portion of the first sector of host data and the second portion of the first sector of host data to the first page and the second page of a same set of multi-level memory cells of the plurality of multi-level memory cells.

7. A system, comprising:
   a non-volatile memory structure having a plurality of multi-level memory cells;
   a processing device; and
   a controller configured to:
      map a first portion of a first sector of host data to a first page associated with the plurality of multi-level memory cells, wherein the first page is associated with bits of a first significance; and
      map a second portion of the first sector of host data to a second page associated with the plurality of multi-level memory cells, wherein the second page is associated with bits of a second significance,
      wherein the first portion of the first sector of host data excludes the second portion of the first sector of host data and the second portion of the first sector of host data excludes the first portion of the first sector of host data such that each of the first page and the second page contains different data from the first sector of host data.

8. The system of claim 7, wherein the controller is further configured to:
   map a first portion of a second sector of host data to the first page; and
   map a second portion of the second sector of host data to the second page.

9. The system of claim 7, further comprising:
   a flash memory integrated circuit that includes the non-volatile memory structure, wherein the flash memory integrated circuit comprises at least a portion of the controller.

10. The system of claim 8, wherein the processing device is configured to write the host data to the non-volatile memory structure via the controller.

11. The system of claim 8, wherein the controller is further configured to:
    map a third portion of the first sector of host data to a third page associated with the plurality of multi-level memory cells; and
    map a third portion of the second sector of host data to the third page,
    wherein the third page is associated with bits of a third significance.

12. The system of claim 7, wherein:
    the first page and the second page form a wordline; and
    the controller is configured to place the first portion of the first sector of host data and the second portion of the first sector of host data to the first page and the second page to thereby interleave the first sector of host data into the wordline.

13. The system of claim 7, wherein the controller is configured to map the first portion of the first sector of host data and the second portion of the first sector of host data to both the first page and the second page of a same set of multi-level memory cells of the plurality of multi-level memory cells.

14. A method, comprising:
    mapping a first portion of a first sector of host data to a first page associated with a plurality of multi-level memory cells, wherein the first page is associated with bits of a first significance; and
    mapping a second portion of the first sector of host data to a second page associated with the plurality of multi-level memory cells, wherein the second page is associated with bits of a second significance,
    wherein the first portion of the first sector of host data excludes the second portion of the first sector of host data and the second portion of the first sector of host data excludes the first portion of the first sector of host data such that each of the first page and the second page contains different data from the first sector of host data.

15. The method of claim 14, further comprising:
    mapping a first portion of a second sector of host data to the first page; and
    mapping a second portion of the second sector of host data to the second page.

16. The method of claim 15, further comprising:
    mapping a third portion of the first sector of host data to a third page associated with the plurality of multi-level memory cells; and
    mapping a third portion of the second sector of host data to the third page,
    wherein the third page is associated with bits of a third significance.

17. The method of claim 14, wherein the first page and the second page form a wordline, and the method further comprises placing the first portion of the first sector of host data and the second portion of the first sector of host data to the first page and the second page to thereby interleave the first sector of host data into the wordline.

18. The method of claim 14, further comprising:
    mapping the first portion of the first sector of host data and the second portion of the first sector of host data to both the first page and the second page of a same set of multi-level memory cells of the plurality of multi-level memory cells.

19. The method of claim 14, further comprising:
    encoding the first sector of host data using an error correcting code.

* * * * *